(12) United States Patent  (10) Patent No.: US 7,855,776 B2
Kuechler et al.  (45) Date of Patent: Dec. 21, 2010

(54) METHODS OF COMPENSATING LENS HEATING, LITHOGRAPHIC PROJECTION SYSTEM AND PHOTO MASK

(75) Inventors: Bernd Kuechler, OT Liegau Augustusbad (DE); Rainer Pforr, Weixdorf (DE); Thomas Muelders, Erding (DE)

(73) Assignee: Qimonda AG, Munich (DE)

( * ) Notice: Subject to any disclaimer, the term of this patent is extended or adjusted under 35 U.S.C. 154(b) by 506 days.

(21) Appl. No.: 12/056,060

(22) Filed: Mar. 26, 2008

(65) Prior Publication Data

US 2009/0244502 A1 Oct. 1, 2009

(51) Int. Cl.
*G03B 27/68* (2006.01)

(52) U.S. Cl. ........................................................ 355/52

(58) Field of Classification Search .................... 355/30, 355/55, 52; 430/5
See application file for complete search history.

(56) References Cited

FOREIGN PATENT DOCUMENTS

JP 2003021914 A * 1/2003

* cited by examiner

*Primary Examiner*—Peter B Kim
(74) *Attorney, Agent, or Firm*—Slater & Matsil, L.L.P.

(57) ABSTRACT

Embodiments relate to compensating for lens heating, lithographic projection system and photo mask. Accordingly, lens heating is compensated by providing a layout pattern including a regular pattern being arranged substantially symmetrical in a first region and a sub-resolution pattern including a plurality of sub-resolution structural elements, wherein the sub-resolution pattern in a second region, so as to minimize non-homogenous lens heating of a projection apparatus in case of a lithographic projection.

25 Claims, 11 Drawing Sheets

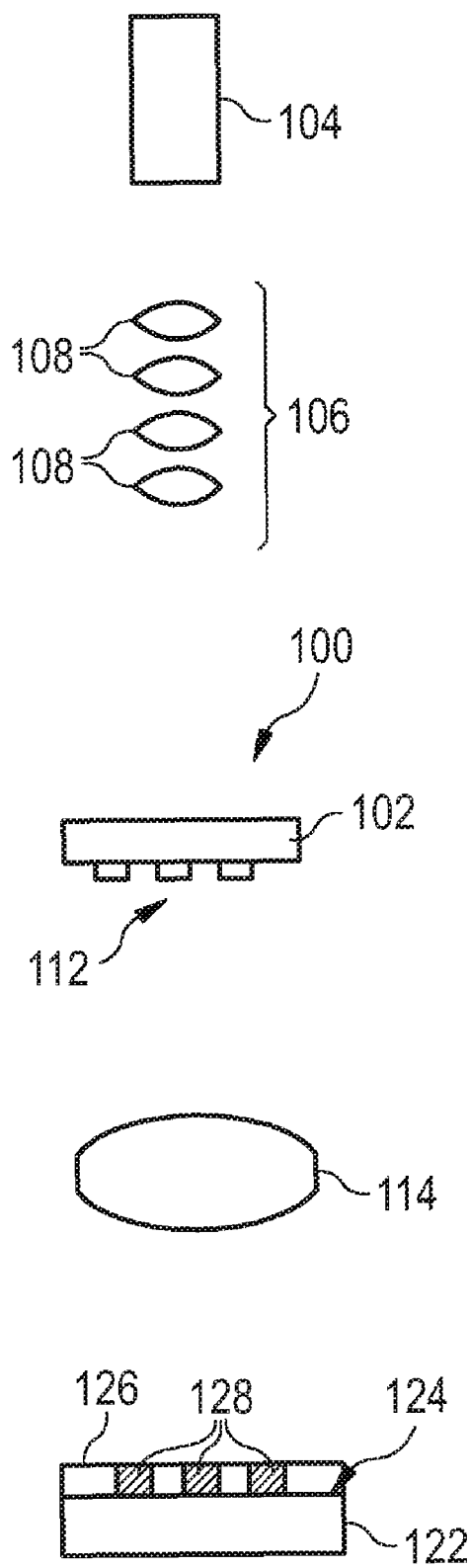

METHODS OF COMPENSATING LENS HEATING, LITHOGRAPHIC PROJECTION SYSTEM AND PHOTO MASK

TECHNICAL FIELD

Embodiments of the invention relate to methods of compensating for lens heating, lithographic projection system and photo mask.

BRIEF DESCRIPTION OF THE DRAWINGS

In the accompanying drawings:

FIG. 1 schematically illustrates an optical projection system in a side view;

DETAILED DESCRIPTION OF ILLUSTRATIVE EMBODIMENTS

Figure 2A:
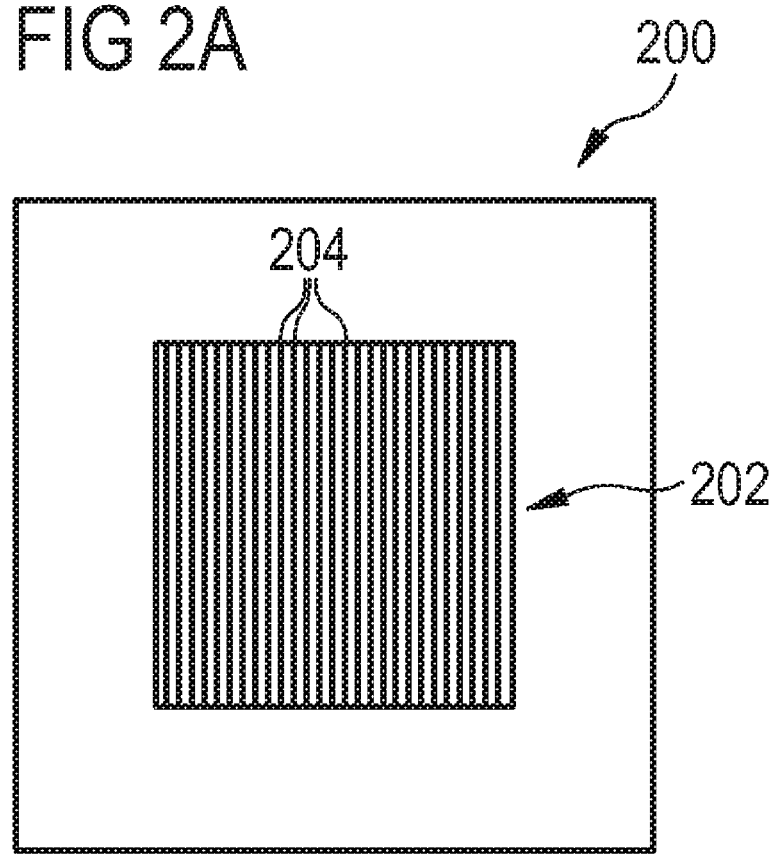
FIG. 2A illustrates a layout pattern in a top view according to an embodiment.

Embodiments of methods and systems for patterning are discussed in detail below. It is appreciated, however, that the present invention provides many applicable inventive concepts that can be embodied in a wide variety of specific contexts. The specific embodiments discussed are merely illustrative of specific ways and do not limit the scope of the invention.

In the following, embodiments of the method and the system are described with respect to improving dimensional accuracy during lithographic projection of a layer of an integrated circuit. The embodiments, however, might also be useful in other respects, e.g., pattern fidelity of two-dimensional structures, improvements in process windows, improvements in printing critical parts of a layout of a pattern, yield enhancement techniques or minimum resolution capabilities of a lithographic projection step.

Furthermore, it should be noted that the embodiments are described with respect to line-space-patterns but might also be useful in other respects including but not limited to dense patterns, semi dense patterns, contact patterns or patterns with isolated lines and combinations between all of them. Lithographic projection can also be applied during manufacturing of different products, e.g., semiconductor circuits, thin film elements. Other products, e.g., liquid crystal panels or the like might be produced as well.

With respect to FIG. 1, a set-up of a lithographic projection apparatus 100 is shown in a side view. It should be appreciated that FIG. 1 merely serves as an illustration, i.e., the individual components shown in FIG. 1 neither describe the full functionality of a lithographic projection apparatus 100 nor are the elements shown true scale. Furthermore, the described embodiment uses a projective optical system in the UV range employing a certain demagnification. However, other lithographic system including proximity projection, reflective projection or the like employing various wavelengths from the visible to ultraviolet to extreme ultraviolet range can be employed.

The projection apparatus 100 comprises a light source 104, which is, e.g., an Excimer laser with 193 nm wavelength. An illumination optic 106 projects the light coming from the light source 104 through a photo mask 102 into an entrance pupil of the projection system. The illumination optic 106 is comprised of several lenses 108, as shown in FIG. 1, which are arranged between the light source 104 and photo mask 102.

The photo mask 102 comprises a mask pattern 112, i.e., being composed of light absorptive or light attenuating elements. Light absorptive elements can be provided by e.g., chrome elements. Light attenuating elements can be provided by, e.g., molybdenum-silicate elements. The mask pattern is derived from a layout pattern which can be provided by a computer aided design system, in which structural elements of the layout pattern are generated and stored.

The light passing the photo mask 102, i.e., not being blocked or attenuated by the above mentioned elements, is projected by projection lens 114 onto the surface 124 of a semiconductor wafer 122. The pattern projected on the semiconductor wafer 122 is usually de-magnified, i.e., scaled down by factor of 4 or 5. For the optical characteristics of the projection apparatus 100, the main contributions are determined by the light source 104, the illumination optic 106, and the projection lens 114 which are further commonly denoted as projection system.

A photo resist film layer 126 is deposited on the semiconductor wafer 122. Onto the resist film layer 126, the mask pattern 112 is projected. After developing the photo resist film layer 126, a three dimensional resist pattern 128 is formed on the surface of the semiconductor wafer 122 by removing those parts of the photo resist film layer 126 which are exposed with an exposure dose above the exposure dose threshold of the resist film layer 126.

Before the layout pattern is fabricated in a high volume manufacturing process, several set-up procedures can be performed including optimizing the illumination process and implementing so called resolution enhancement techniques (RET) which improve the resolution capabilities of the lithographic projection apparatus.

Off-axis illumination is achieved by providing an annular-, quasar-, quadrupole- or dipole-shaped aperture stop in a conjugated plane of the illumination optic 106 of lithographic projection apparatus 100 thus enhancing contrast and depth of focus of densely spaced patterns. In turn, off-axis illumination often impairs imaging of isolated structures. In order to allow imaging of isolated structures, sub resolution sized assist features are used which facilitate the resolution of these structures.

Setting up a lithographic projection includes selecting a specific illumination mode, for example, dipole illumination as described above. Dipole illumination is in particular helpful when printing dense line-space arrays.

As an example, a fraction of a layout pattern for a specific layer is shown in FIG. 2A in a top view. The layout pattern 200 includes a critical structure in DRAM manufacturing with a line-space array 202 having vertical parallel lines 204. The exemplary layout pattern can be used as a pattern for a cell array within a memory chip and peripheral circuits. Topological representations of memory cells and layout arrangements for respective circuits are known in the art and are therefore not discussed further.

Figure 2B:
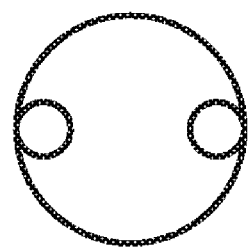
FIG. 2B diagrammatically illustrates a lens fill spectrum in a top view according to an embodiment.

Referring now to FIG. 2B, a resulting lens fill spectrum during a lithographic projection is described when using the layout pattern 200. The resulting lens fill spectrum 210 can be derived from conventional simulation tools. Simulation tools are provided by many manufactures, including Mentor Graphics Inc., ASML Inc. or other companies.

The object spectrum is shown schematically by two individual circular areas. Accordingly, the projection lens of a lithographic imaging apparatus is subject to non uniform light distribution. The light is partly absorbed by the lens. Hence the lens has non uniform temperature distribution resulting in a change of optical path length and further resulting in wavefront aberration.

Since heating of lens material increases over the time during which the lens is exposed to light, the wavefront aberration is a function of time until it reaches a stationary state. However, in a stationary state aberrations can be out of a productive range and cannot be corrected by optical correction elements inside the lithographic imaging tool.

In summary, correction of wavefront aberrations is usually done by optical elements in the lithographic imaging tool that can be adjusted by software. Lens heating induced aberrations can be only partly corrected with those optical elements.

Figure 3A:
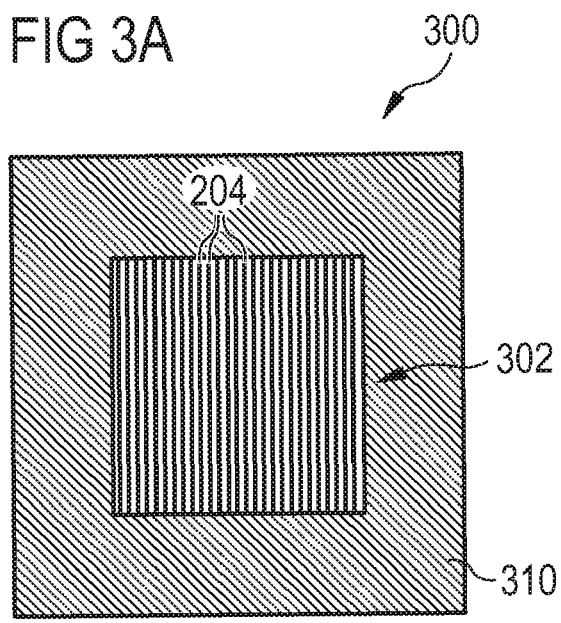
FIG. 3A illustrates a layout pattern in a top view according to an embodiment.

According to an embodiment, a fraction of a further layout pattern for a specific layer is shown in FIG. 3A in a top view. The layout pattern 300 includes a critical structure in DRAM manufacturing with a line-space array 302 having vertical parallel lines 304. The clear surrounding of the array is filled with an array consisting of sub-resolution line-space array 310 with 45° tilt with respect to the vertical parallel lines 304. These lines of array 310 will not be printed in resist at nominal exposure. They will also not influence the performance of the features of line-space array 302.

Figure 3B:
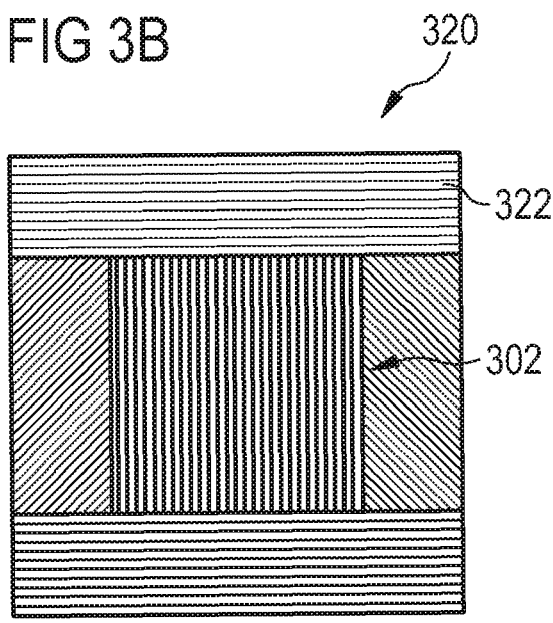
FIG. 3B illustrates a layout pattern in a top view according to an embodiment.

As a further example, a fraction of a further layout pattern 320 for a specific layer is shown in FIG. 3B in a top view. The layout pattern 320 includes a critical structure in DRAM manufacturing with a line-space array 302 having vertical parallel lines 304. The clear surrounding of the array 302 is filled with an array including a sub-resolution line-space array 322 having either line space array or a checkerboard like grating. These lines of array 322 will not be printed in resist at nominal exposure. It will allow further homogenizing the object spectrum in the pupil and therefore further improving the lens-heating control.

Figure 3C:
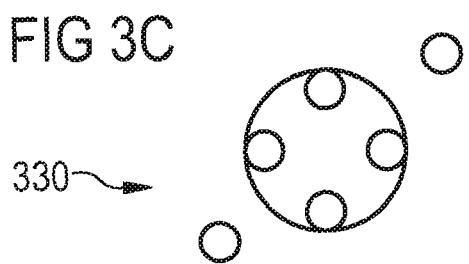
FIG. 3C diagrammatically illustrates a lens fill spectrum in a top view according to an embodiment.

Due to the features in the array surrounding in FIG. 3A or 3B the pupil fill 330 becomes more symmetric, as shown in FIG. 3C. Hence much less asymmetric lens heating occurs, i.e., the respective caused wavefront aberrations are much smaller, as shown in FIG. 3C. FIG. 3C shows exemplarily that the usage of other feature groups in the array surrounding can further homogenize the pupil fill and can result in reduced or even negligible lens heating driving wavefront aberrations.

Figure 4A:
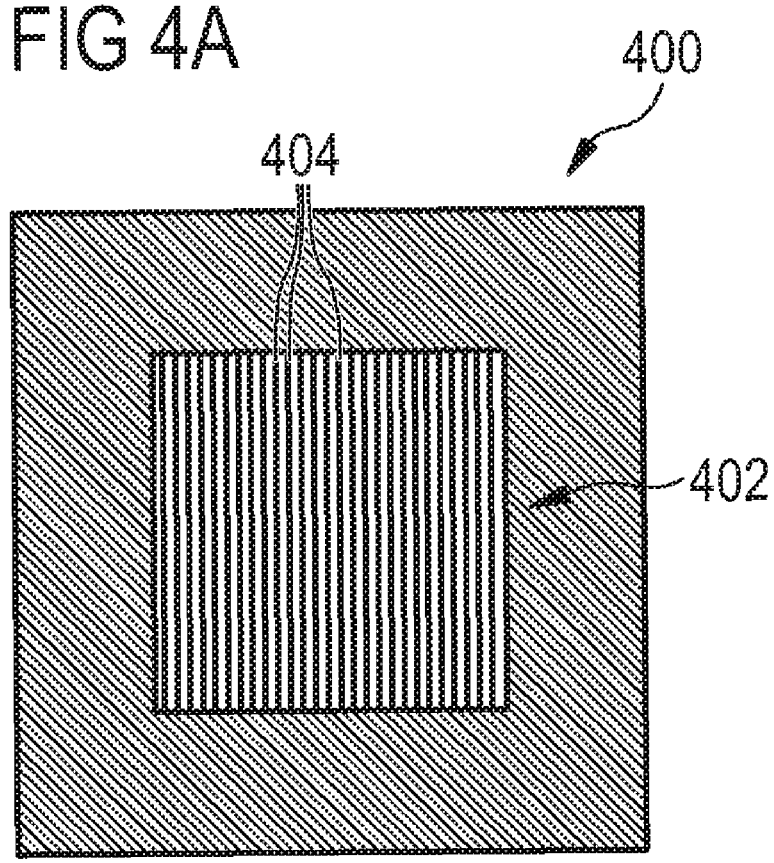
FIG. 4A illustrates a layout pattern in a top view according to an embodiment.

As a further example, a fraction of a layout pattern for a specific layer is shown in FIG. 4A in a top view. The layout pattern 400 includes a critical structure in DRAM manufacturing with a line-space array 402 having vertical parallel lines 404. FIG. 4A shows basically the same situation as in FIG. 2A except the surrounding of the line-space array 402 which is arranged as a dark field, i.e., resist remains in this image field region after mask printing in a positive tone resist.

Figure 4B:
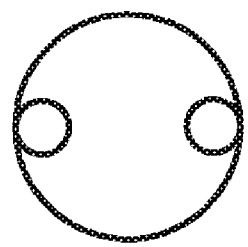
FIG. 4B diagrammatically illustrates a lens fill spectrum in a top view according to an embodiment.

Referring now to FIG. 4B, a resulting lens fill spectrum during a lithographic projection is described when using the layout pattern 400. The resulting lens fill spectrum 410 can be described by two individual circular areas. Accordingly, the projection lens of a lithographic imaging apparatus is subject to non uniform light distribution.

Figure 5A:
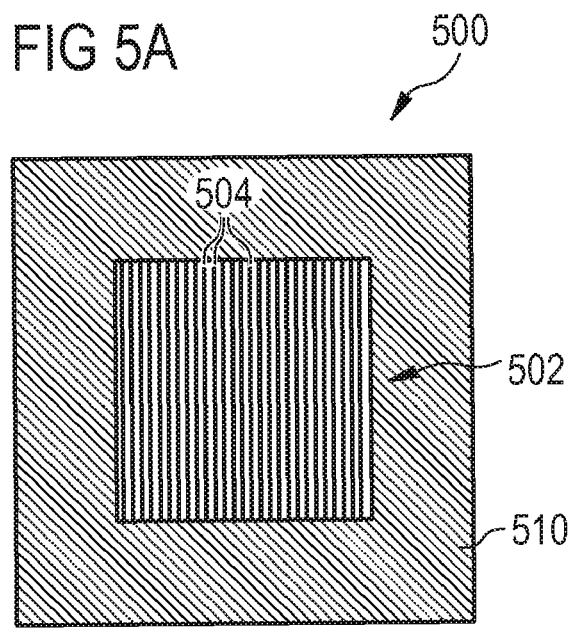
FIG. 5A illustrates a layout pattern in a top view according to an embodiment.

According to an embodiment, a fraction of a further layout pattern 500 for a specific layer is shown in FIG. 5A in a top view. The dark surrounding of the array 502 is filled with an array consisting of sub-resolution line-space array 510 with a 45° tilt with respect to the vertical parallel lines 504.

Instead of dark sub-resolution features light sub-resolution features are placed in the surrounding area of array 502. These lines of array 510 will not be printed in resist at nominal exposure. They will also not influence the performance of the features of line-space array 502.

Figure 5B:
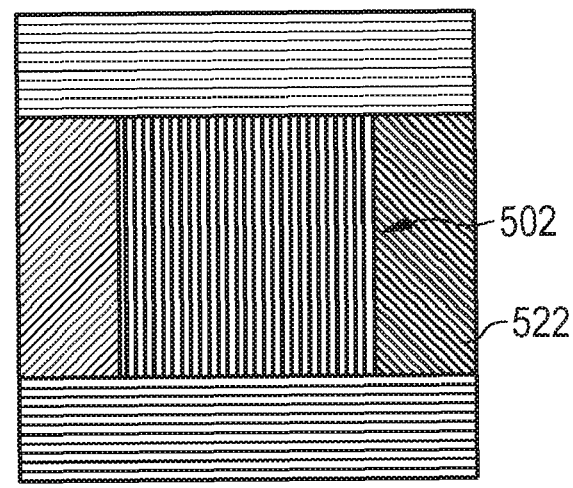
FIG. 5B illustrates a layout pattern in a top view according to an embodiment.

According to a further embodiment the dark surrounding of the array 502 is filled with an array including a sub-resolution line-space array 522 having a checkerboard like grating, as shown in FIG. 5B. This arrangement is comparable to FIG. 3B.

Again, instead of dark sub-resolution features, light sub-resolution features are placed in the surrounding area. In all examples the sub-resolution features are made such that they will not be printed in resist, but will distribute the light more homogeneous across the pupils of respective individual lenses.

Figure 5C:
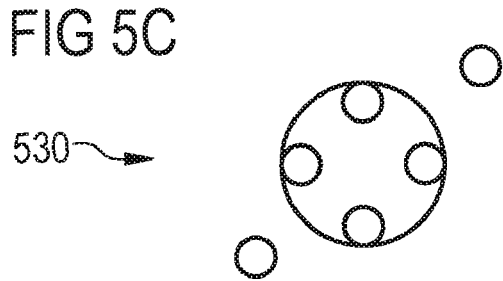
FIG. 5C diagrammatically illustrates a lens fill spectrum in a top view according to an embodiment.

This is reflected in the attached object spectrum 530 in the pupil, as shown in FIG. 5C. Accordingly, asymmetric lens heating is reduced as the respective caused wavefront aberrations are much smaller, as shown in FIG. 5C.

FIG. 5C shows exemplarily that the usage of other feature groups in the array surrounding can further homogenize the pupil fill and can result in reduced or even negligible lens heating driving wavefront aberrations. By varying the frequency of the gratings the position of the diffracted light beams in the pupil can be optimized.

It is within the scope of the embodiments described above that the pattern frequency of sub-resolution features can be chosen such that the diffracted beams will not hit the pupil plane. The diffracted beams will be absorbed in the lens column surrounding the projection lens before the pupil plane. This also results in compensating lens heating effects.

Figure 6A:
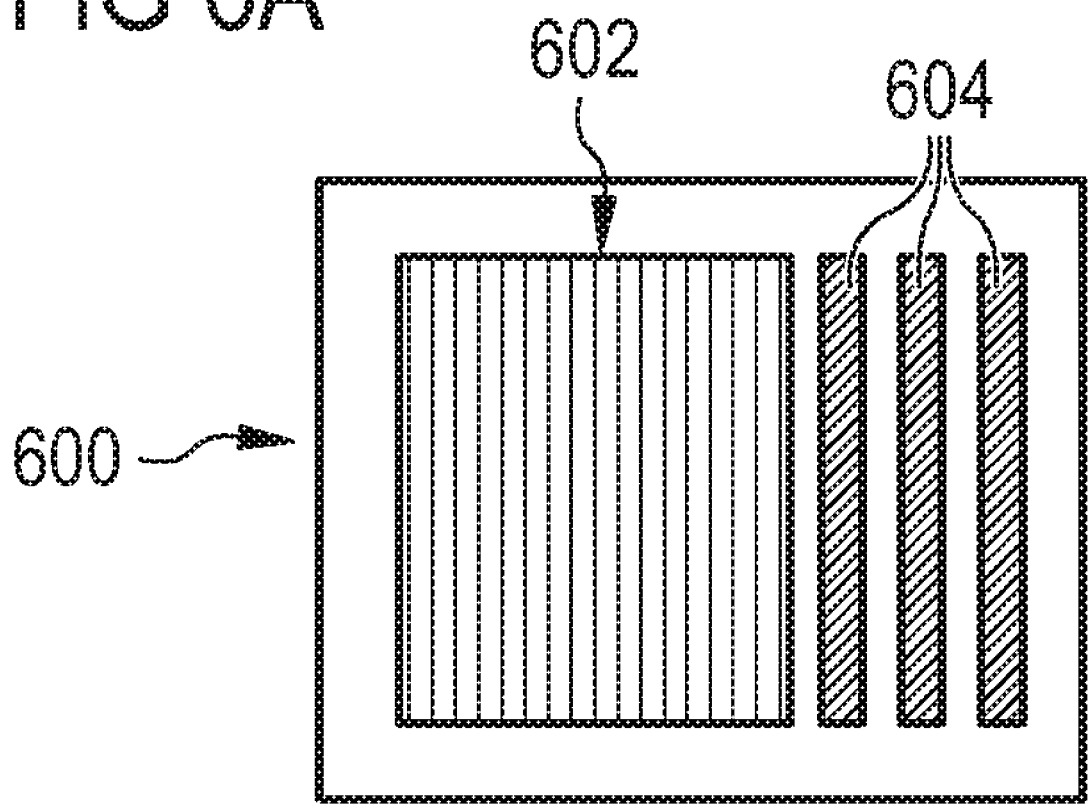
FIG. 6A illustrates a layout pattern in a top view according to an embodiment.

With respect to FIG. 6A a small section of the layout 600 is shown. The layout 600 includes an array 602 of lines and spaces. Furthermore, layout 600 includes several isolated lines 604 having a line width larger than the minimal resolution of projection apparatus 100.

Figure 6B:
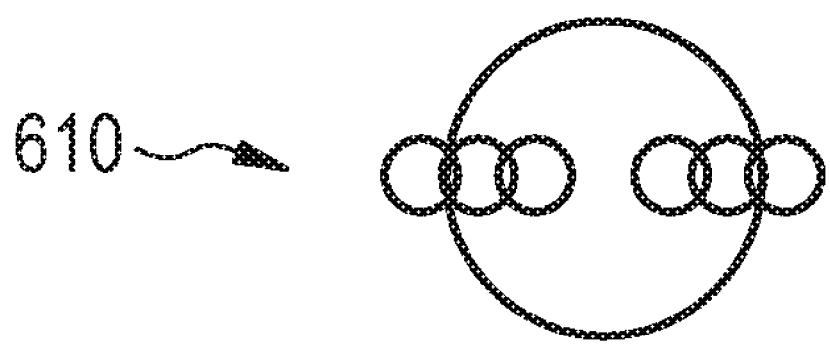
FIG. 6B diagrammatically illustrates a lens fill spectrum in a top view according to an embodiment.

As shown in FIG. 6B, the array 602 causes a strong asymmetric object spectrum 610 in case of dipole illumination. This again results in severe asymmetric heating of the lenses and consequently in large lens heating driven wavefront aberrations.

Figure 7A:
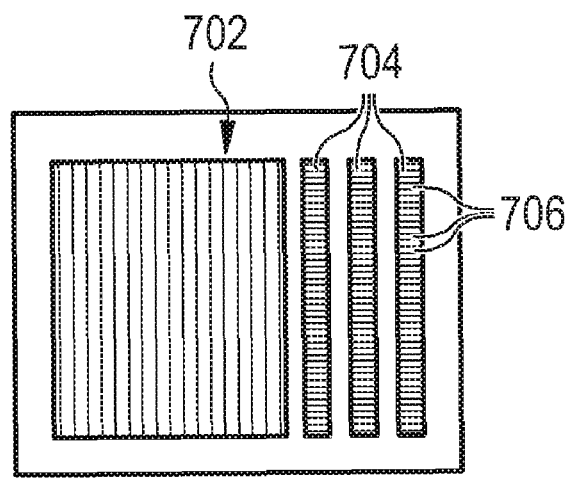
FIG. 7A illustrates a layout pattern in a top view according to an embodiment.

FIG. 7A shows a further exemplarily embodiment for a layout of the features of the pattern 702 together with sub-resolution features. Transparent horizontally oriented sub-resolution features 706 are placed within the lines 704 having a line width larger than the minimal resolution of projection apparatus 100 so as to not severely influence the imaging performance of these lines.

Figure 7B:
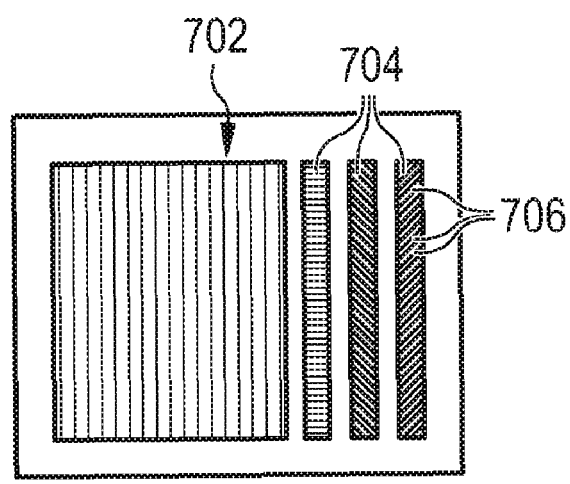
FIG. 7B illustrates a layout pattern in a top view according to an embodiment.

FIG. 7B shows a further embodiment for a layout of the features. In addition to the embodiment of FIG. 7A, transparent sub-resolution features 706 are shown with horizontal and diagonal orientation. Similar as explained with respect to FIG. 7A, the sub-resolution features do not severely influence the imaging performance of the isolated lines.

Figure 7C:
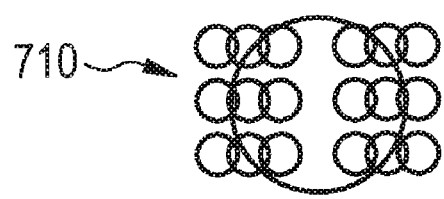
FIG. 7C diagrammatically illustrates a lens fill spectrum in a top view according to an embodiment.

In summary, the sub-resolution features do not alter the imaging performance of the isolated lines but do contribute to an improvement of the homogeneity of the object spectrum 710, as shown in FIG. 7C. Accordingly, a reduction of lens heating driven aberrations can be achieved.

Previous embodiments have been described with respect to dipole illumination, which is generally selected for projecting line-space arrays. In the following quadrupole, illumination is used, e.g., by providing a corresponding aperture stop.

Figure 8A:
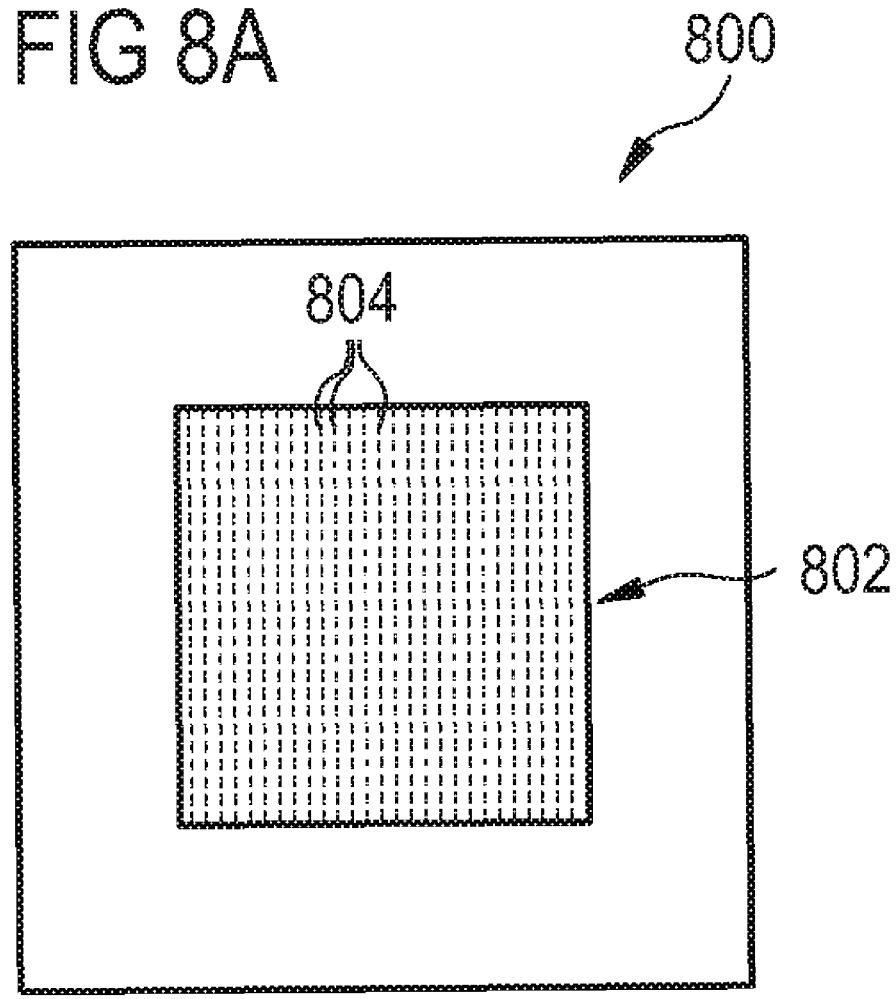
FIG. 8A illustrates a layout pattern in a top view according to an embodiment.

FIG. 8A shows the part of a layout 800 consisting of an array 802 with vertically oriented checkerboard like lines 804 which are interrupted. For imaging an optimized illuminator is used, e.g., a quadrupole illuminator.

Figure 8B:
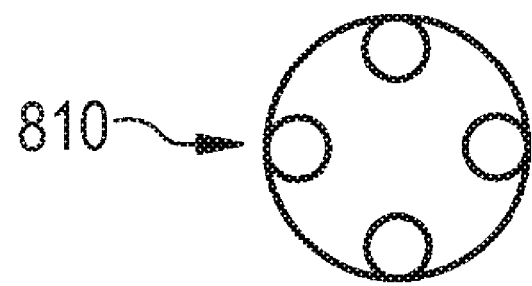
FIG. 8B diagrammatically illustrates a lens fill spectrum in a top view according to an embodiment.

The illuminator setting results in the object spectrum in the pupil, as shown in FIG. 8B. Although the object spectrum 810 shows x-y symmetry, there is still an inhomogeneous intensity distribution. Therefore inhomogeneous lens heating can occur resulting in wavefront aberrations as described above.

Figure 9A:
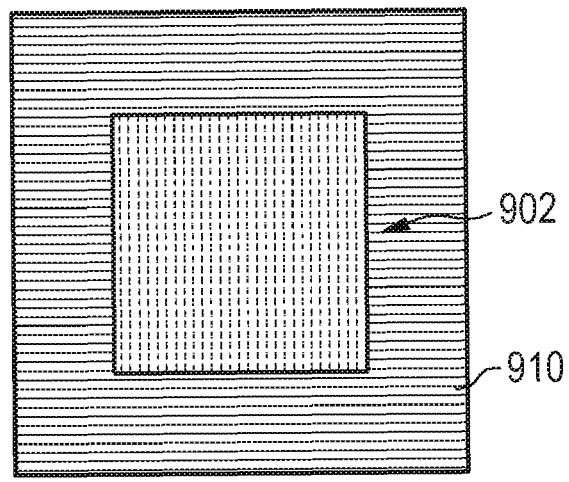
FIG. 9A illustrates a layout pattern in a top view according to an embodiment.

With respect to FIG. 9A, placing a sub-resolution grating pattern 910 according to an embodiment is shown. The sub resolution features 910 are arranged in the transparent region outside the vertically oriented checkerboard like lines pattern 902 of the layout.

Figure 9B:
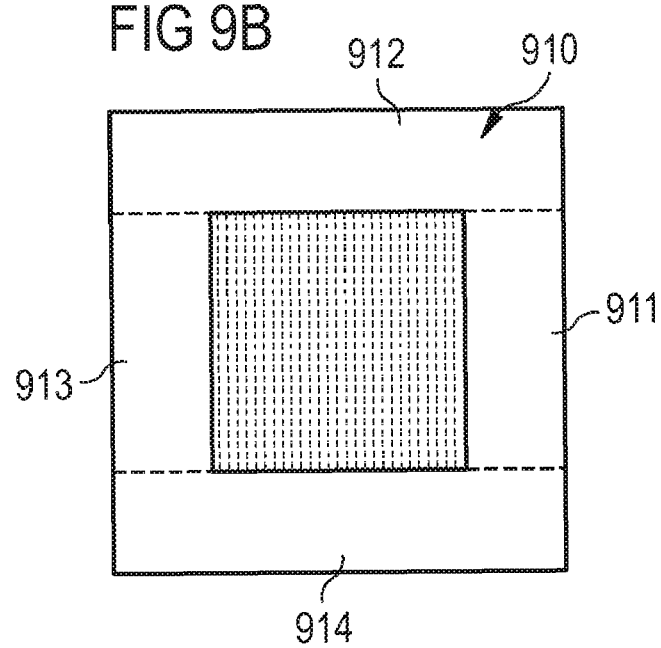
FIG. 9B illustrates a layout pattern in a top view according to an embodiment.

With respect to FIG. 9B, placing a sub-resolution grating pattern according to an embodiment is shown. The sub resolution features 910 are arranged in the transparent region outside the vertically oriented checkerboard like line pattern of the layout, similar as shown in FIG. 9A.

Here, the transparent region surrounding checkerboard line pattern 910 is split-up into four different sub-areas 911 to 914 including sub-resolution features. In each of these areas different feature types, pitches and pattern arrangement for the sub-resolution features can be arranged.

Figure 9C:
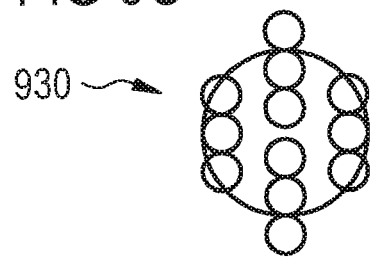
FIG. 9C diagrammatically illustrates a lens fill spectrum in a top view according to an embodiment.

All the sub-resolution features described with reference to FIGS. 9A and 9B are sub-resolution, i.e., will not be printed during lithographic projection. The presence of the sub-resolution features leads to a homogenization of the pupil fill, as shown in FIG. 9C. As a consequence more homogeneous pupil fill 930 results in less pronounced lens heating causing reduced wavefront aberrations.

Figure 10A:
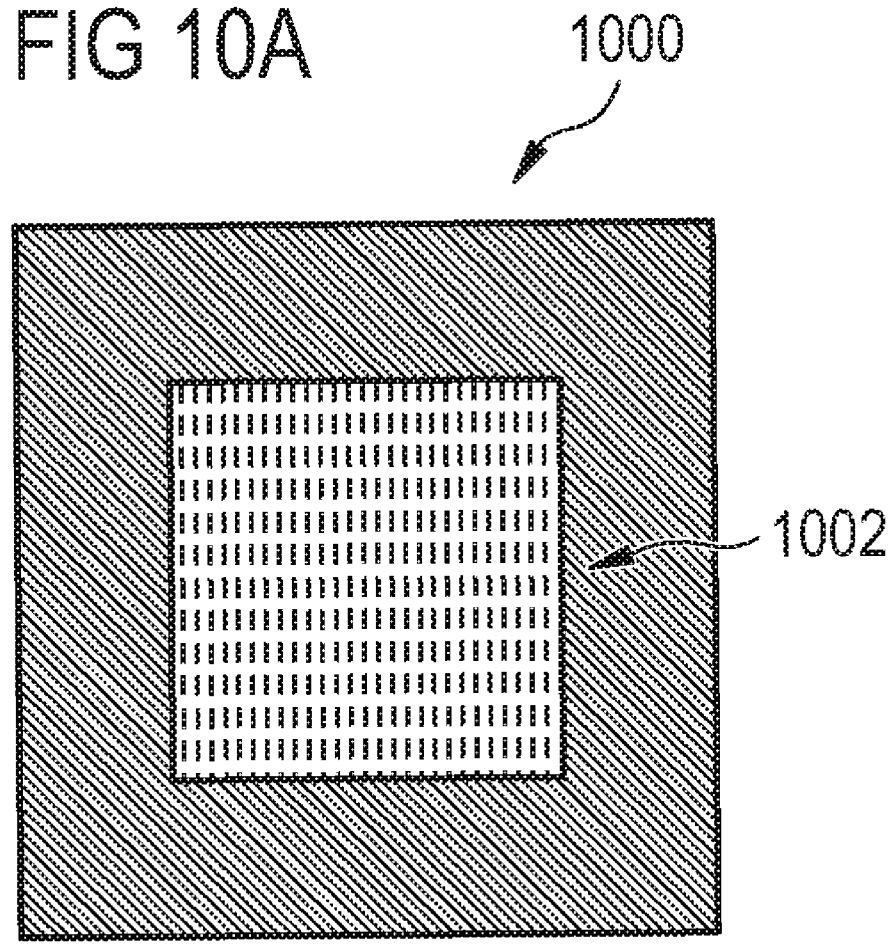
FIG. 10A illustrates a layout pattern in a top view according to an embodiment.

FIG. 10A shows a layout comparable to FIG. 8A. Here, a part of a layout consisting of an array with vertically oriented checkerboard like interrupted lines similar to FIG. 8A except the surrounding of the line-space array 1002 which is arranged as a dark field, i.e., resist remains in this image field region after mask printing in a positive tone resist.

Figure 10B:
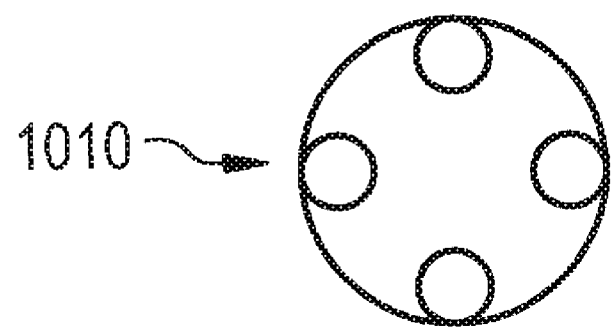
FIG. 10B diagrammatically illustrates a lens fill spectrum in a top view according to an embodiment.

Referring now to FIG. 10B, a resulting lens fill spectrum during a lithographic projection is depicted when using the layout pattern 1000. The resulting lens fill spectrum 1010 can be described by four individual circular areas. Accordingly, the projection lens of a lithographic imaging apparatus is subject to non uniform light distribution.

Although the object spectrum shows x-y symmetry, there is still an inhomogeneous intensity distribution. Therefore inhomogeneous lens heating can occur resulting in wavefront aberrations as described above.

Figure 11A:
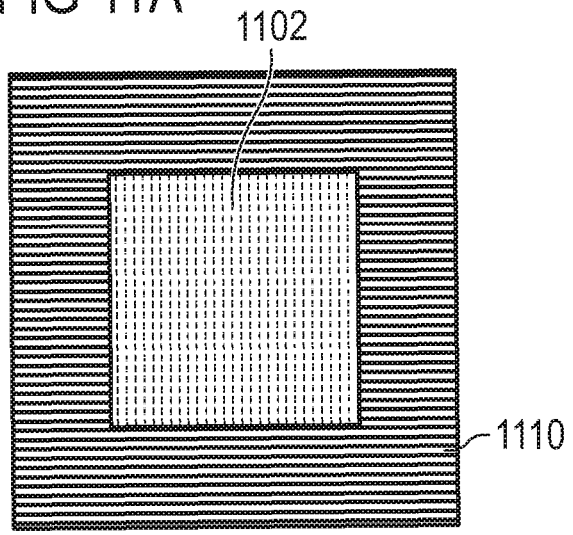
FIG. 11A illustrates a layout pattern in a top view according to an embodiment.

With respect to FIG. 11A, placing a sub-resolution grating pattern 1110 according to an embodiment is shown. The sub resolution features are arranged in the transparent region outside the vertically oriented checkerboard like lines pattern 1102 of the layout.

Figure 11B:
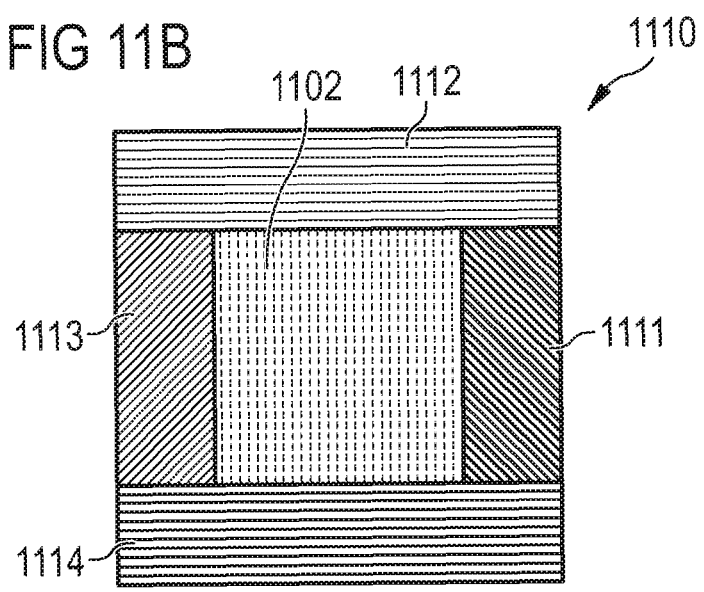
FIG. 11B illustrates a layout pattern in a top view according to an embodiment.

With respect to FIG. 11B, placing a sub-resolution grating pattern according to an embodiment is shown. The sub resolution features are arranged in the transparent region outside the vertically oriented checkerboard like line pattern of the layout, similar as shown in FIG. 11A.

Here, the transparent region surrounding checkerboard line pattern 1102 is split-up into four different sub-areas 1111 to 1114 including sub-resolution features. In each of these areas different feature types, pitches and pattern arrangement for the sub-resolution features can be arranged. Accordingly, either line space array or checkerboard like array can be implemented.

All the sub-resolution features described with reference to FIGS. 11A and 11B are sub-resolution, i.e., will not be printed during lithographic projection. Instead of dark sub resolution features as used with respect to FIGS. 9A and 9B the embodiment of FIGS. 11A and 11B provide clear sub-resolution features in a dark area.

Figure 11C:
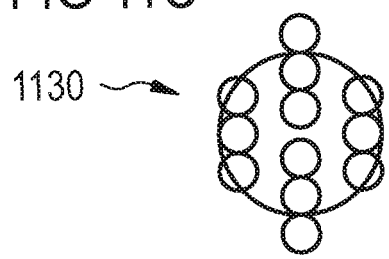
FIG. 11C diagrammatically illustrates a lens fill spectrum in a top view according to an embodiment.

The presence of the sub-resolution features leads to a homogenization of the pupil fill 1130, as shown in FIG. 11C. As a consequence more homogeneous pupil fill results in less pronounced lens heating causing reduced wavefront aberrations.

Microelectronic circuits consist of structured layers of different materials. Microlithography is a commonly used technique to structure these layers. A photosensitive material is coated on the material to be structured. In a lithographic projection apparatus the photosensitive coating is partly exposed to light using a mask containing the pattern to be transferred into the layers to be structured.

Accordingly, in the un-patterned areas of the mask additional sub-resolution patterns with specific dimensions and orientation such that the light is diffracted in such a manner that the lens heating effects are reduced or avoided. This is foreseen for transparent as well as for light-blocking (dark) areas of the mask.

Furthermore it is in the scope to micro-pattern large features of the layout in the same sense, i.e., for instance an isolated non-critical line pattern will split-up into various sub-patterns with small sub-resolution spaces in between. This can also be achieved for large transparent patterns, i.e., by employing an n-tone resist.

In all cases the lens heating controlling sub-patterning is done according to the rules for lens heating compensation. An additional criterion of placing the lens heating controlling features is that the imaging performance of the "active features" is not impacted, positively impacted or only impacted in a controlled acceptable manner. It is in the scope of embodiments of the invention to furthermore replace sub-resolution assist features for resolution enhancement techniques with lens heating controlling features.

Having described embodiments of the invention, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and the particularity required by the patent laws, what is claimed and desired to be protected by Letters Patent is set forth in the appended claims.

What is claimed is:

1. A method of compensating lens heating of a projection lens in a lithographic projection apparatus during projection of a mask onto a substrate, the method comprising:
   providing a layout pattern including a regular pattern that is arranged substantially symmetrical in a first region;
   providing a sub-resolution pattern including a plurality of sub resolution structural elements;
   arranging the sub-resolution pattern in a second region, so as to minimize non-homogenous lens heating of a projection apparatus in case of a lithographic projection;
   providing a photo mask including the layout pattern and the sub-resolution pattern; and
   performing a lithographic projection using the photo mask.

2. The method according to claim 1, wherein the second region is different to the first region.

3. The method according to claim 1, wherein the pattern in the first region comprises further structural elements, the second region being arranged within the further structural elements.

4. The method according to claim 1, wherein the sub-resolution pattern comprises transparent structural elements on the photo mask.

5. The method according to claim 1, wherein the sub-resolution pattern comprises light absorbing or attenuating structural elements on the photo mask.

6. The method according to claim 1, wherein the non-homogenous lens heating is calculated during a simulation step.

7. The method according to claim 1, wherein the non-homogenous lens heating is calculated during a measurement of an aberration parameter.

8. The method according to claim 7, wherein the aberration parameter is measured in a steady state of the projection apparatus.

9. The method according to claim 8, wherein the steady state includes a steady state of thermal heating of one or more lens elements.

10. The method according to claim 1, further comprising:
    providing a semiconductor wafer having a resist layer formed over an upper surface thereof, wherein performing a lithographic projection comprises defining a pattern in the resist layer; and
    modifying the upper surface of the semiconductor wafer based on the pattern.

11. A method of compensating lens heating of a projection lens in a lithographic projection apparatus during projection of a mask onto a substrate, the method comprising:
    providing a layout pattern including a regular pattern being arranged substantially symmetrical in a first region;
    providing a sub-resolution pattern including a plurality of sub-resolution structural elements;
    optimizing the sub-resolution pattern in a second region by reducing non symmetrical aberrations of a projection apparatus in case of lithographic projection;
    providing a photo mask including the layout pattern and the sub-resolution pattern; and performing a lithographic projection using the photo mask.

12. The method according to claim 11, wherein the optimizing further comprises selecting feature types, pitches and pattern arrangement of the sub-resolution pattern.

13. The method according to claim 11, wherein the optimizing further comprises selecting feature types, pitches and pattern arrangement of the sub-resolution pattern within several different sub-regions of the second region.

14. The method according to claim 13, wherein the sub-resolution pattern is arranged with substantially different orientation with respect to the layout pattern.

15. The method according to claim 11, wherein the optimizing further comprises determining a pupil fill of a lens of the projection apparatus.

16. The method according to claim 15, wherein the pupil fill is derived by performing a wavefront measurement of the projection apparatus.

17. The method according to claim 15, wherein the projection apparatus is capable of providing off-axis illumination.

18. The method according to claim 11, wherein at least part of structural elements of the sub-resolution pattern are arranged as a sub-resolution assist feature to the layout pattern.

19. The method according to claim 11, wherein the optimizing comprises inserting, removing, relocating or modifying structural elements of the sub-resolution pattern.

20. The method according to claim 11, further comprising:
    providing a semiconductor wafer having a resist layer formed over an upper surface thereof, wherein performing the lithographic projection comprises defining a pattern in the resist layer; and
    modifying the upper surface of the semiconductor wafer based on the pattern.

21. A photo mask capable of compensating lens heating of a projection lens in a lithographic projection apparatus during projection onto a substrate, the photo mask comprising:
    a layout pattern including a regular pattern being arranged substantially symmetrical in a first region; and
    a sub-resolution pattern including a plurality of sub-resolution structural elements, wherein the sub-resolution pattern in a second region, so as to minimize non-homogenous lens heating of a projection apparatus in case of a lithographic projection.

22. The photo mask according to claim 21, wherein the sub-resolution pattern is arranged with substantially different orientation with respect to the layout pattern.

23. A lithographic projection system comprising:
    an imagining system capable of exposing a photo mask including a layout pattern including a regular pattern being arranged substantially symmetrical in a first region and a sub-resolution pattern including a plurality of sub-resolution structural elements;
    a projection system capable of projection light from the photo mask onto a substrate;

a movable stage arranged under the projection system, the movable stage configured to hold a substrate; whereby the sub-resolution pattern in a second region, reduces non-homogenous lens heating of a projection system during a lithographic projection.

24. The lithographic projection system according to claim 23, wherein the sub-resolution pattern is arranged with substantially different orientation with respect to the layout pattern.

25. A method of making a semiconductor device, the method comprising:

providing a semiconductor wafer with a resist layer formed on a surface thereof;

providing a photo mask comprising a photo mask capable of compensating lens heating of a projection lens in a lithographic projection apparatus during projection onto a substrate, the photo mask comprising a layout pattern including a regular pattern being arranged substantially symmetrical in a first region, and a sub-resolution pattern including a plurality of sub-resolution structural elements, wherein the sub-resolution pattern in a second region, so as to minimize non-homogenous lens heating of a projection apparatus in case of a lithographic projection;

illuminating the resist layer through the photo mask;

developing the resist layer thereby exposing a patterned portion of the semiconductor wafer; and modifying the upper surface of the semiconductor wafer in relation to the patterned portion.

\* \* \* \* \*